(12) United States Patent
Botti et al.

(10) Patent No.: US 6,288,605 B1
(45) Date of Patent: Sep. 11, 2001

(54) POWER SWITCHING OUTPUT STAGE WITH DEAD ZONE MINIMIZATION AND POSSIBILITY OF PARALLEL SYNCHRONOUS CONNECTION

(75) Inventors: Edoardo Botti, Vigevano; Danilo Ranieri, Sesto S. Giovanni, both of (IT)

(73) Assignee: STMicroelectronics S.R.L., Agrate Brianza (IT)

(*) Notice: Subject to any disclaimer, the term of this patent is extended or adjusted under 35 U.S.C. 154(b) by 0 days.

(21) Appl. No.: 09/484,756

(22) Filed: Jan. 18, 2000

(30) Foreign Application Priority Data

Jan. 19, 1999 (IT) ................................. VA99A0003

(51) Int. Cl.[7] .............................. H03F 3/38; H03F 3/217
(52) U.S. Cl. ................................. 330/10; 330/251
(58) Field of Search .................................. 330/10, 124 R, 330/207 A, 251

(56) References Cited

U.S. PATENT DOCUMENTS 5,963,086 * 10/1999 Hall ........................................ 330/10

* cited by examiner

Primary Examiner—Steven J. Mottola
(74) Attorney, Agent, or Firm—Theodore E. Galanthay; Allen, Dyer, Doppelt, Milbrath & Gilchrist, P.A.

(57) ABSTRACT

A switching output power stage, including a power switching device for the supply line and a complementary power switching device for the ground rail driven in phase opposition by a pulse width modulated (PWM) drive signal, is provided with sensors detecting a substantial turn-off state of each of the two power switching devices and generating a pair of logic signals. A combinatory logic circuit combines the drive signal and the pair of logic signals and generates a pair of driving signals of opposite phase for the respective power switching devices. The switching to a turn-on state of any of the two power devices is enabled upon verifying a substantially attained turn-off state by the device complementary to the device commanded to turn-on, irrespective of the process spread and of changes of temperature load conditions and of configuration of a plurality of output stages of a multichannel amplifier.

23 Claims, 12 Drawing Sheets

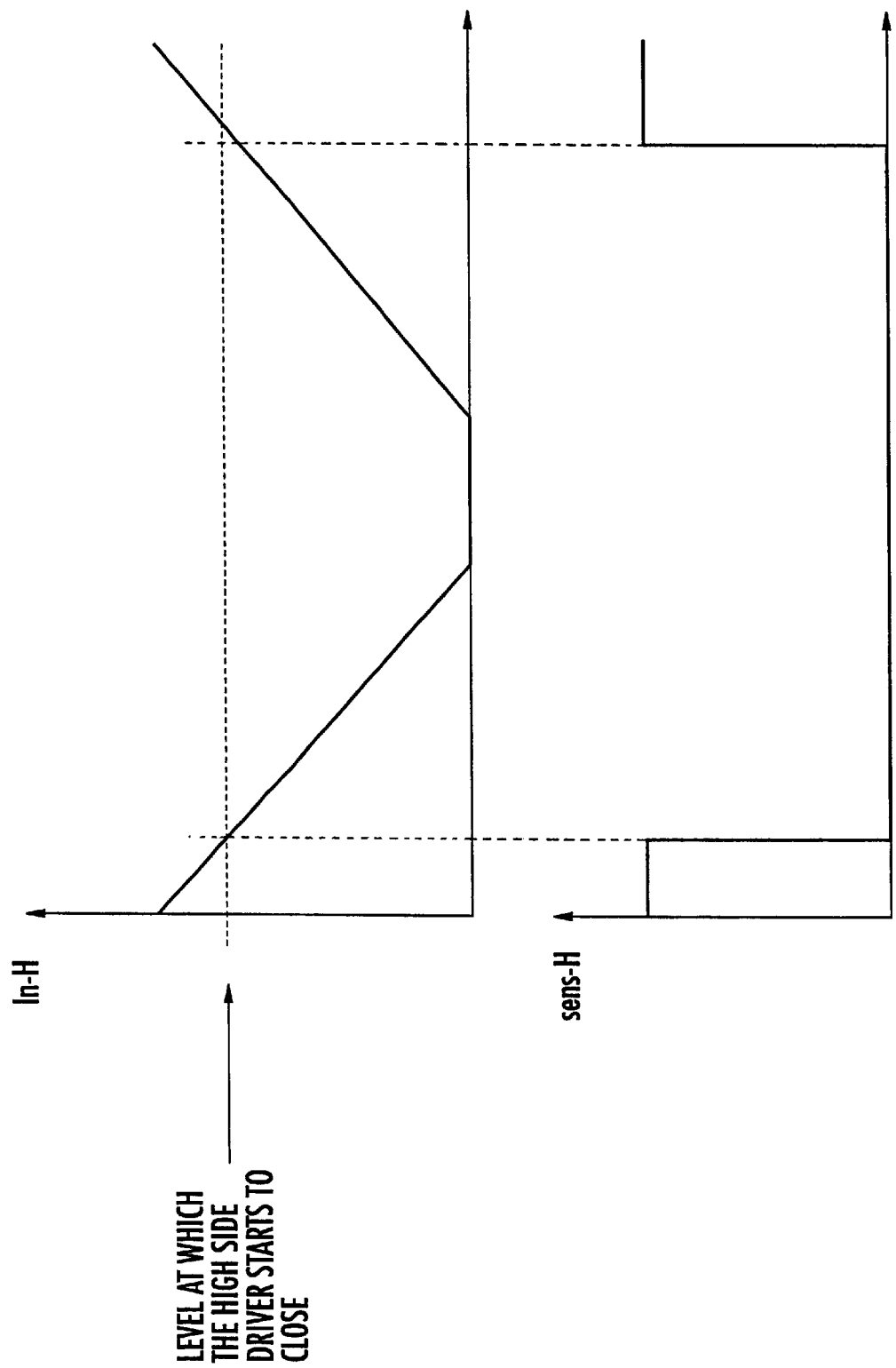

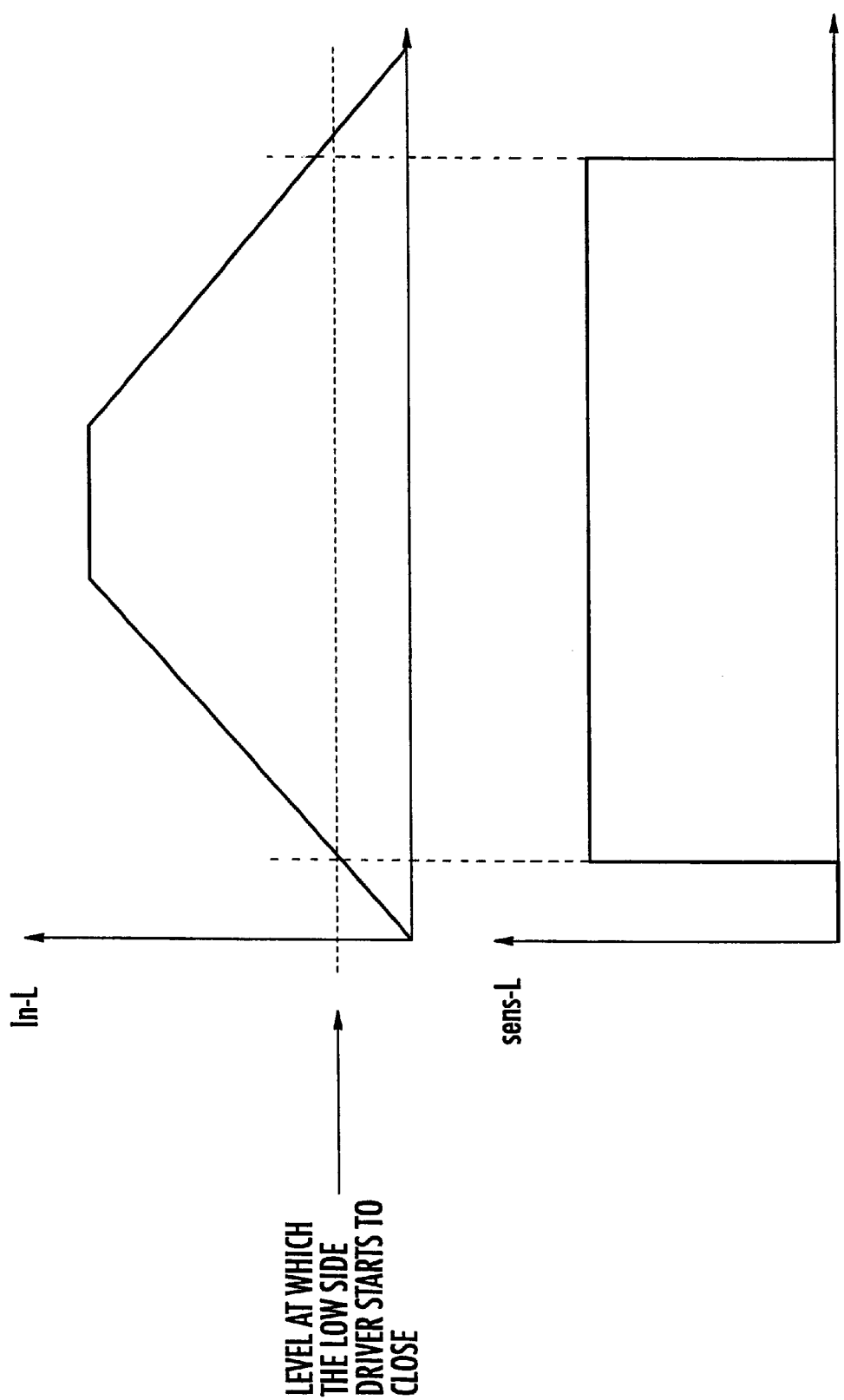

POWER SWITCHING OUTPUT STAGE WITH DEAD ZONE MINIMIZATION AND POSSIBILITY OF PARALLEL SYNCHRONOUS CONNECTION

FIELD OF THE INVENTION

The present invention relates to the field of power switching output stages, and more particularly, to amplifiers operating in Pulse Width Modulation (PWM). The invention is particularly useful for multichannel audio amplifiers that are configurable in different modes of operation by connecting their respective output power stages in parallel according to different schemes.

BACKGROUND OF THE INVENTION

In many applications, particularly in the field of power amplifiers for low and medium frequency signals, and primarily in the field of high efficiency audio amplifiers, a Pulse Width Modulation with switching frequencies of up to several hundreds of KHz is often a preferred approach. In these applications, the output power stage includes at least a power device switching the output to the supply line (HIGH SIDE DRIVER) and at least a complementary power device, switching the output to the ground line (Low SIDE DRIVER), driven by a digital PWM signal that may have a switching frequency of several hundreds of KHz.

PWM power stages are often realized monolithically on the same chip that contains the drive and control circuitry, and it is necessary to ensure that the turn-on of one or the other of the two power switching devices, respectively of one and the other switching branch of the output node, never happens before the other device has already started the turn-off. If so, this would increase the power dissipation in the superposition intervals and, because of the high switching frequency, could lead to the failure of the power devices.

To prevent such a destructive condition from occurring, a small time interval must be established, during which both power transistors of the output stage are turned-off. Such an interval is commonly referred to as "dead zone" or "dead time". In all the applications where it is necessary to ensure a high accuracy (such as in low distortion audio applications), the dead time should be minimized for obvious reasons.

Commonly, to avoid a simultaneous turn-on of the two branches of a output power stage, a dead zone for prevention of accidental overlapping of the turn-on commands for the two complementary devices of the stage is determined, by suitable delay circuits, based on RC networks dimensioned to ensure a certain delay, that is established by considering the worst condition of operation. In practice it is very difficult or almost impossible to fully optimize the delay value introduced in the turn-on commands because of the impossibility of effective electrical values of the manufacturing process of the integrated circuit, of their temperature dependence as well as of the variability of the load and other parameters that may affect it in a more or less marked manner.

The known solutions do not allow an optimization for minimizing the dead time value to be introduced in the turn-on signal of the complementary pair of power transistors of the output stage. moreover, in many applications, as in high efficiency audio amplifiers, in order to ensure most efficient driving conditions, switching from a bridge to single ended driving modes and vice versa is often implemented.

SUMMARY OF THE INVENTION

The present invention offers an effective approach in the form of a particularly efficient and versatile power switching output stage in order to optimize the requirements set forth above.

The circuit of the invention provides a power stage which is exempt of the cross-conduction phenomenon (simultaneous conduction of the two power switching devices) and able to automatically adapt itself to any intervening variation of electrical parameters due to the spread of the manufacturing process of temperature and of the load. The circuit of the invention allows a plurality of output stages to be externally connected in parallel, according to a selected scheme in a simple and programmable manner, while ensuring a perfectly effective control of the switching conditions of the power devices from an off state to a conduction state, in any configuration.

Different paralleling schemes of the output stages of different amplification channels, according to a certain number of admitted configurations, are made possible or rendered easier by the present invention. For example, to obtain high output power from audio reproduction apparatuses installed in vehicles, loudspeakers of a relatively low resistance typically on the range of 1–0.5 Ohm can be used, while in other applications of lower output power and a larger number of channels, 4 Ohm loudspeakers can be used.

BRIEF DESCRIPTION OF THE DRAWINGS

The different aspects and advantages of the invention will become more evident through the following description of several embodiments and by referring to the attached drawings, in which:

FIGS. 6*a* and 6*b* show the mechanism by which the turn-on commands of the two complementary devices of the power stage are conditioned by the circuit of the invention;

DETAILED DESCRIPTION OF THE PREFERRED EMBODIMENTS

Considering the case of a high efficiency switching audio amplifier as an example of an application of the invention, FIGS. 1, 2, 3, and 4 illustrate the block diagram of a monolithic high efficiency amplifier, highlighting four different configurations made possible by the present invention for adapting the amplifier to different types of loads represented by one or more loudspeakers in the examples.

The need to ensure a safeguarding turn-on control of all the pairs of complementary power devices of the different output stages, considering the several possible different operating configurations of the output stages of the amplifier, requires certain characteristics for any effort of optimization because the worst operating condition expectable in any one of the different configurations that the amplifier can assume must be accounted for. The circuit of the invention overcomes these evident difficulties securing an effective minimization of the dead zone or turn-off dead time of the power devices that is preserved by a self-adapting ability to the variations of the important parameters.

Figure 1:
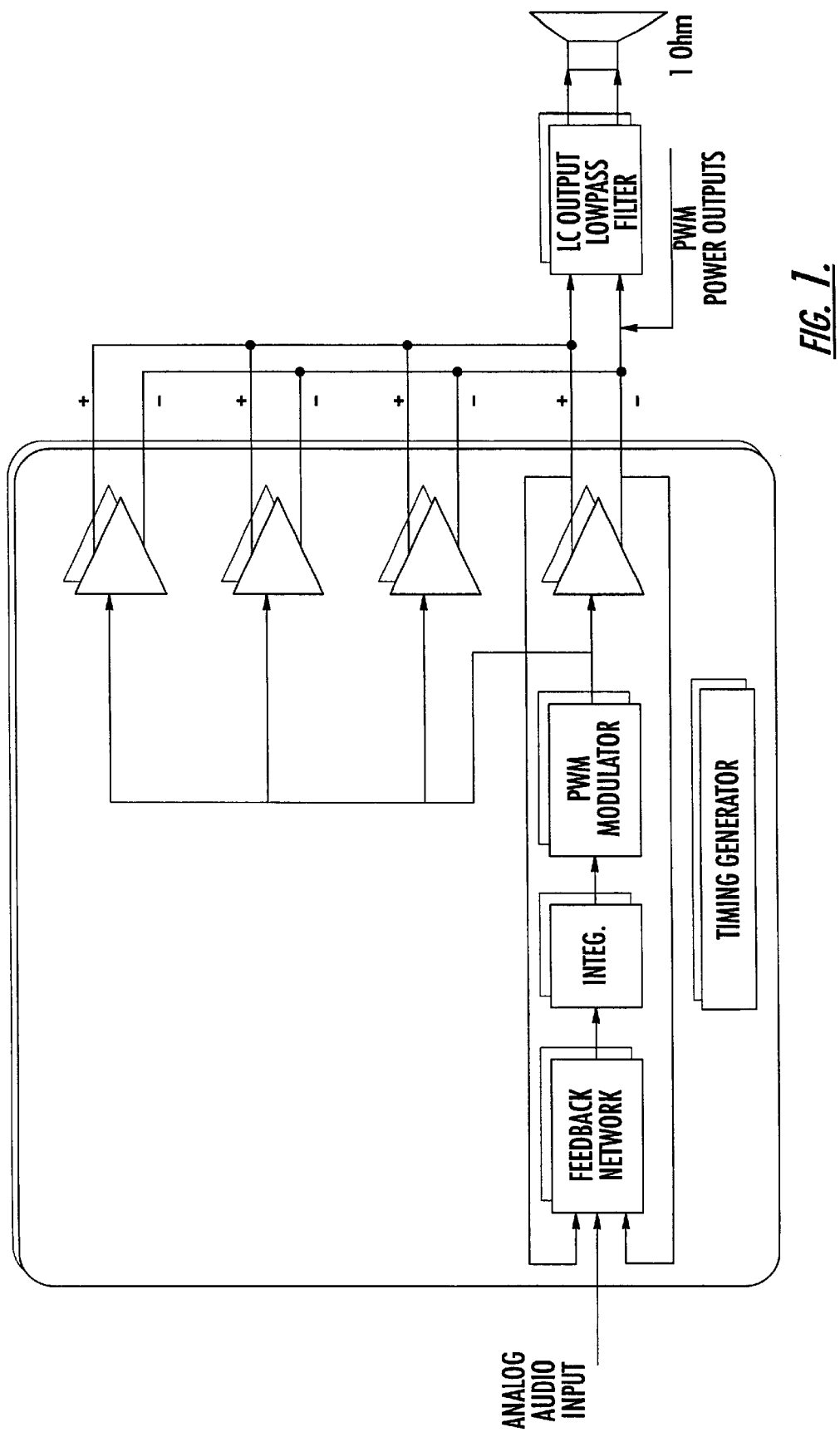
FIGS. 1, 2, 3 and 4 illustrate different configurations in which a high efficiency monolithic amplifier can be set.
Figure 2:
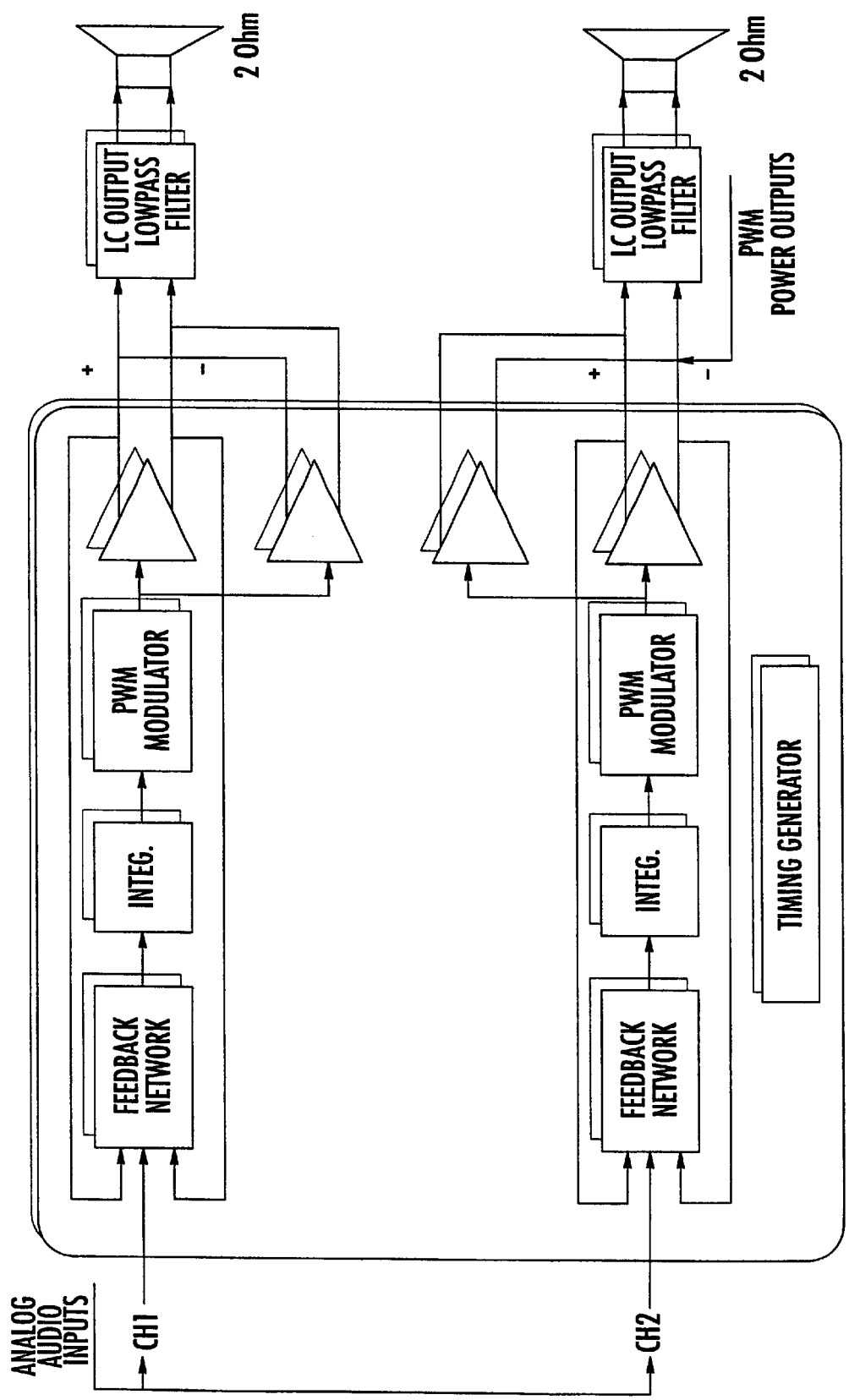
Figure 3:
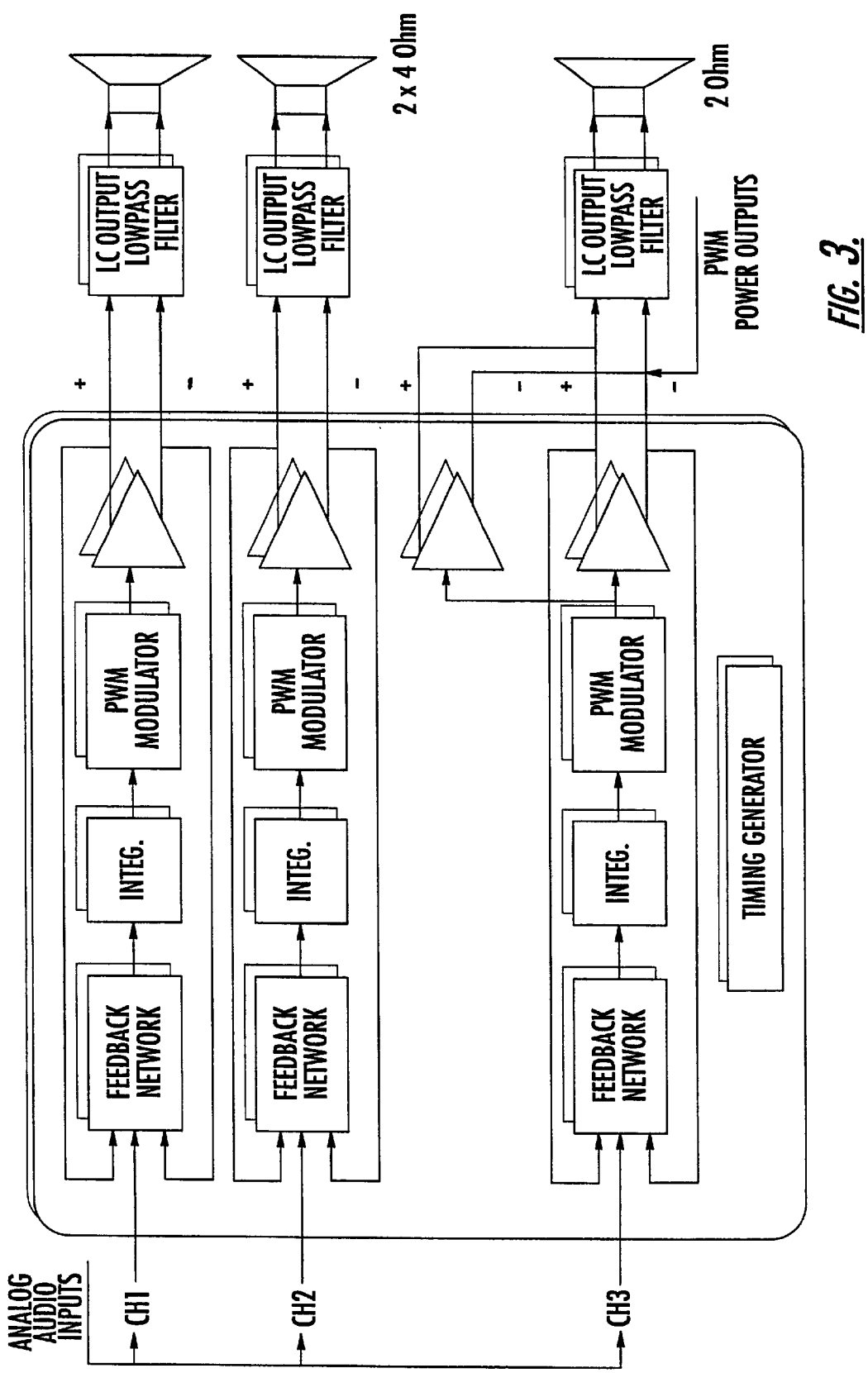
Figure 4:
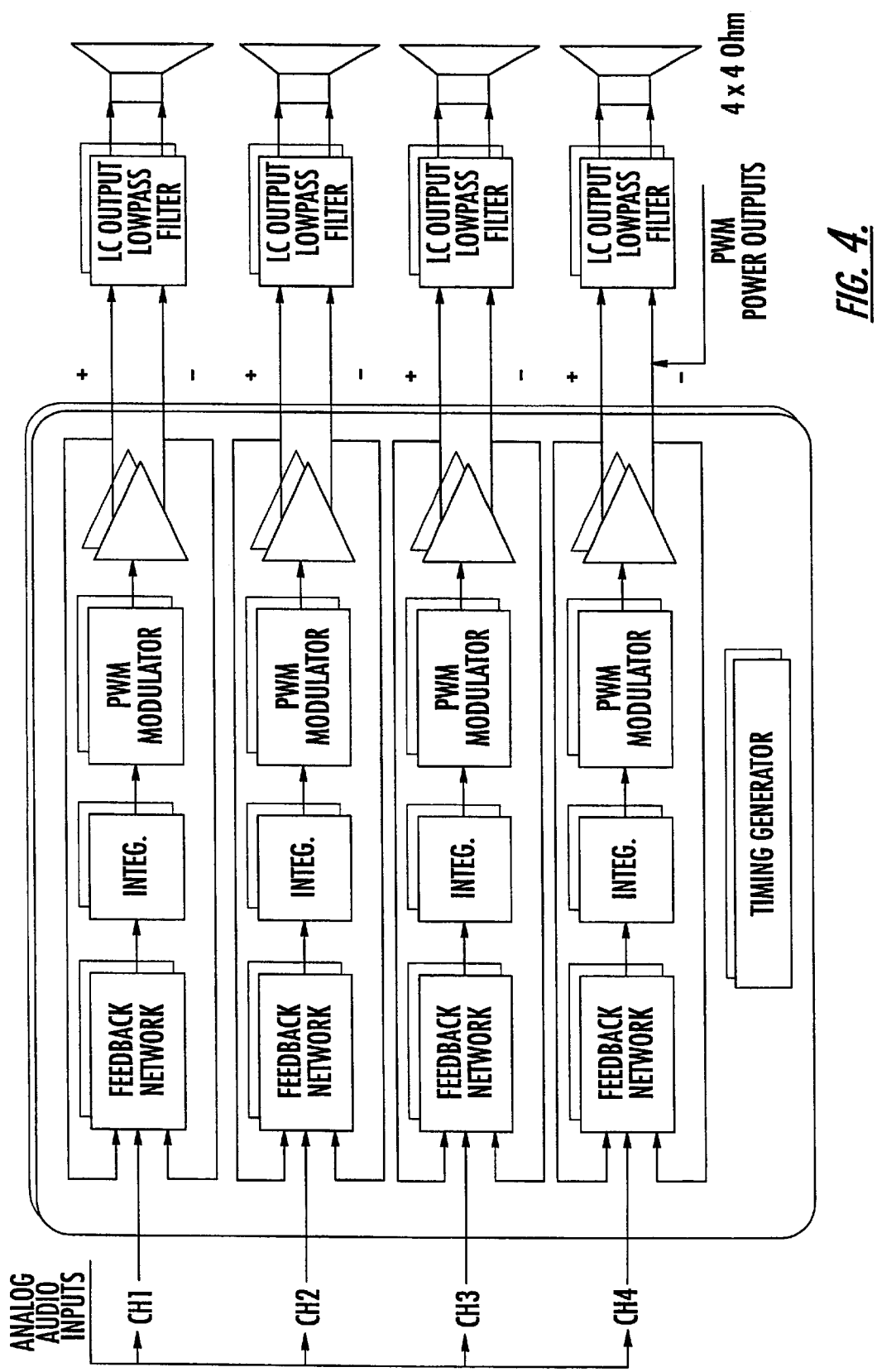
Figure 5:
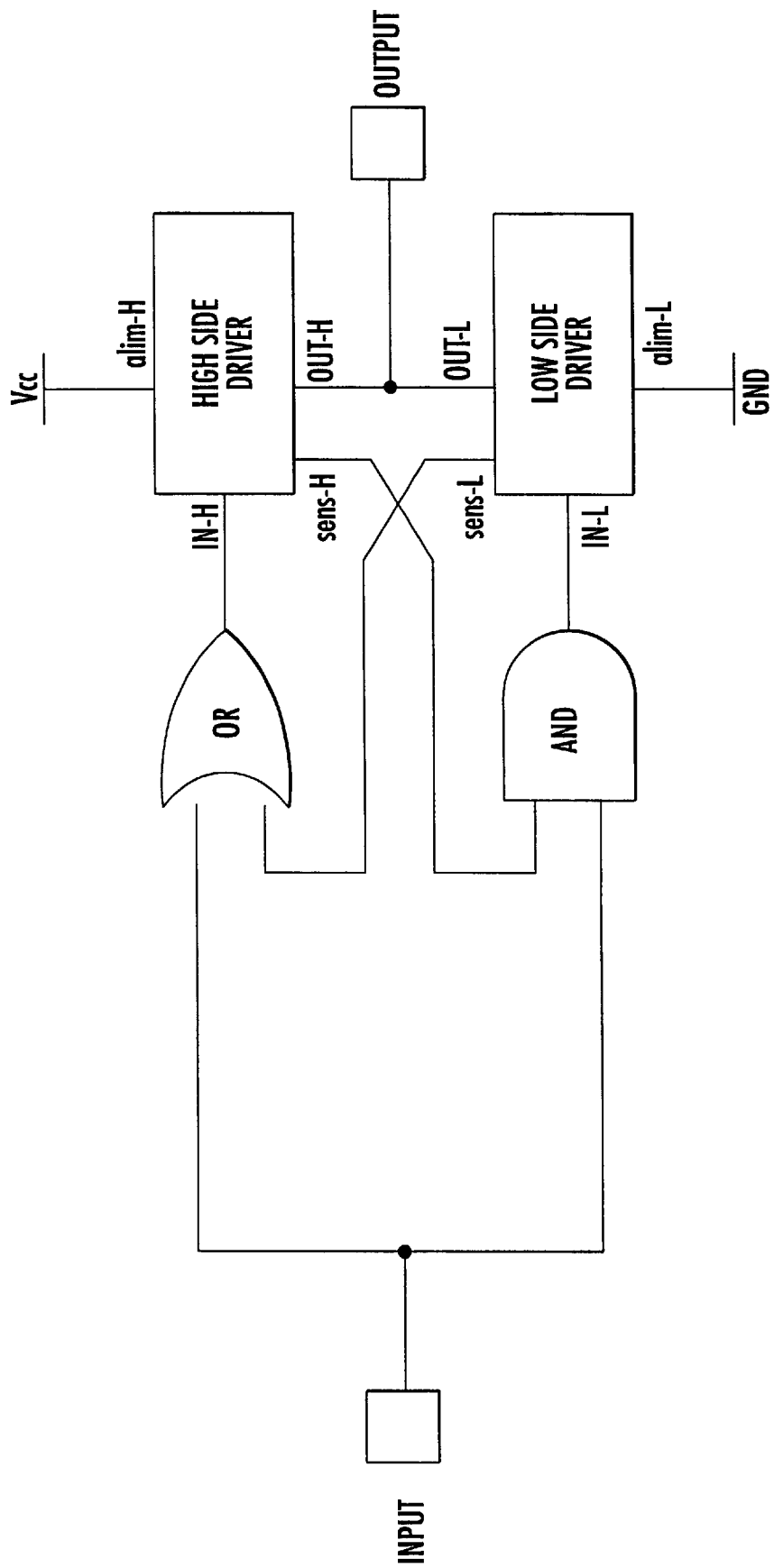
FIG. 5 is a basic circuit diagram of a power switching output stage according to the present invention.

A basic diagram of the circuit of the power switching output stage of the invention is shown in FIG. 5. Generally, each one of the pair of power switching complementary devices constituting the HIGH SIDE DRIVER and Low SIDE DRIVER stages, respectively, is provided with a circuit capable of monitoring the turn-on or the turn-off state, producing a respective logic signal, sens-H and sens-L, and indicating the state of the switching device. The pair of logic signals is combined with the digital driving input signal (INPUT) by a combinatory logic circuit, realized in the example by an AND gate switching the Low SIDE DRIVER device to ground potential and an OR gate switching the HIGH SIDE DRIVER device to the supply line. This ensures the switching from a cut-off state to a conduction state of one or the other power-switching device only if it is enabled to do so by a positive verification of the substantially attained turn-off state of the switching device complementary to the switching device commanded to turn-on.

Figure 7B:
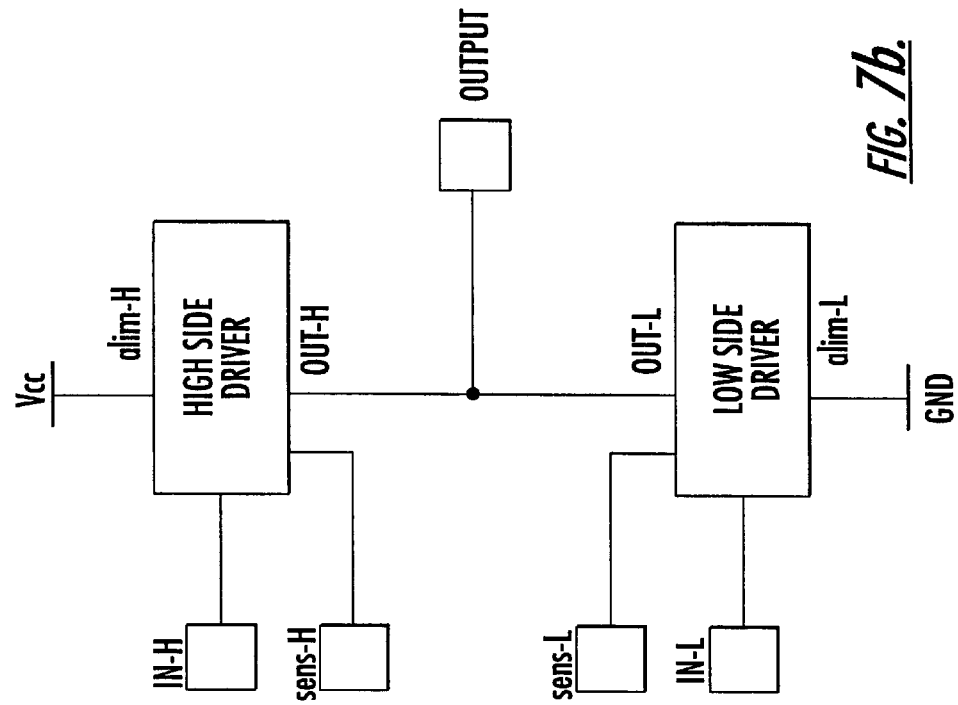
FIGS. 7*a* and 7*b* show a detailed basic scheme of detection of the turn-off or turn-on state of the respective power switching device of the output stage and the relative block diagram of the integrated stage.

FIGS. 6*a* and 6*b* respectively show how the turn-on enabling logic signal pair, sens-H and sens-L, is generated as a function of the verification of the respective driving signal reaching a level appropriate to acknowledge that a cut-off phase of the complementary device has already started. Such a detection may be effectively implemented for example in the way illustrated in FIGS. 7*a* and 7*b*.

Figure 7A:
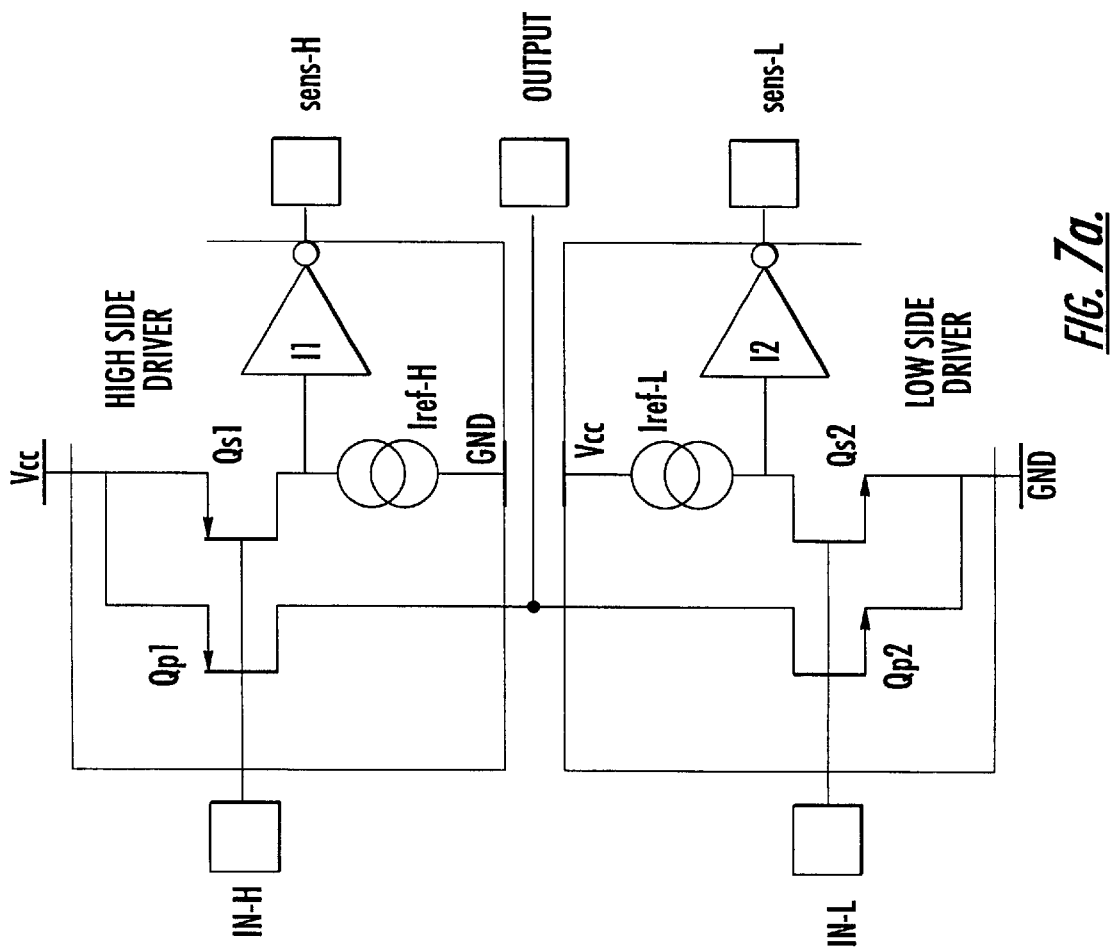

The detailed circuit diagram of FIG. 7*a*, highlights a preferred embodiment of the devices employed for detecting the state of the power devices Qp1 and Qp2 constituting the output stage. Each power device has an associated transistor of the same kind, respectively Qs1 and Qs2, but having fractional dimensions, which may be between $1/100^{th}$ and $1/100^{th}$ of the dimensions of the respective power device Qp1 and Qp2. Each detecting transistor has an associated bias load current generator Iref-H and Iref-L. The output node of the stage so constituted is coupled to the input of a logic inverter I1 and I2.

The detection transistor, Qs1 and Qs2, is driven in parallel with the respective power transistor, Qp1 and Qp2, and when the current exceeds the current established by the respective bias current generator, Iref-H and Iref-L, the respective inverter I1 and I2, switches to generate an output logic signal, respectively sens-H and sens-L, as illustrated in the diagrams of FIGS. 6*a* and 6*b*.

Establishing a certain current level, definable by dimensioning the respective current generators Iref-H and Iref-L, suitable to consider as practically off the respective power switching device Qp1 and Qp2, according to the schemes indicated in FIGS. 6*a* and 6*b*, a pair of logic signals is obtained. Sens-H and sens-L reliably confirm a substantially attained cut-off phase of one or the other of the two power switching devices of the stage. The two logic signals, sens-H and sens-L, combined to the driving digital signal INPUT, ensure the absence of overlapping of turn-on states of the two power devices of the stage, under any operating condition, being substantially unaffected by process spread, change of configuration, variations of temperature and load conditions.

Figure 8:
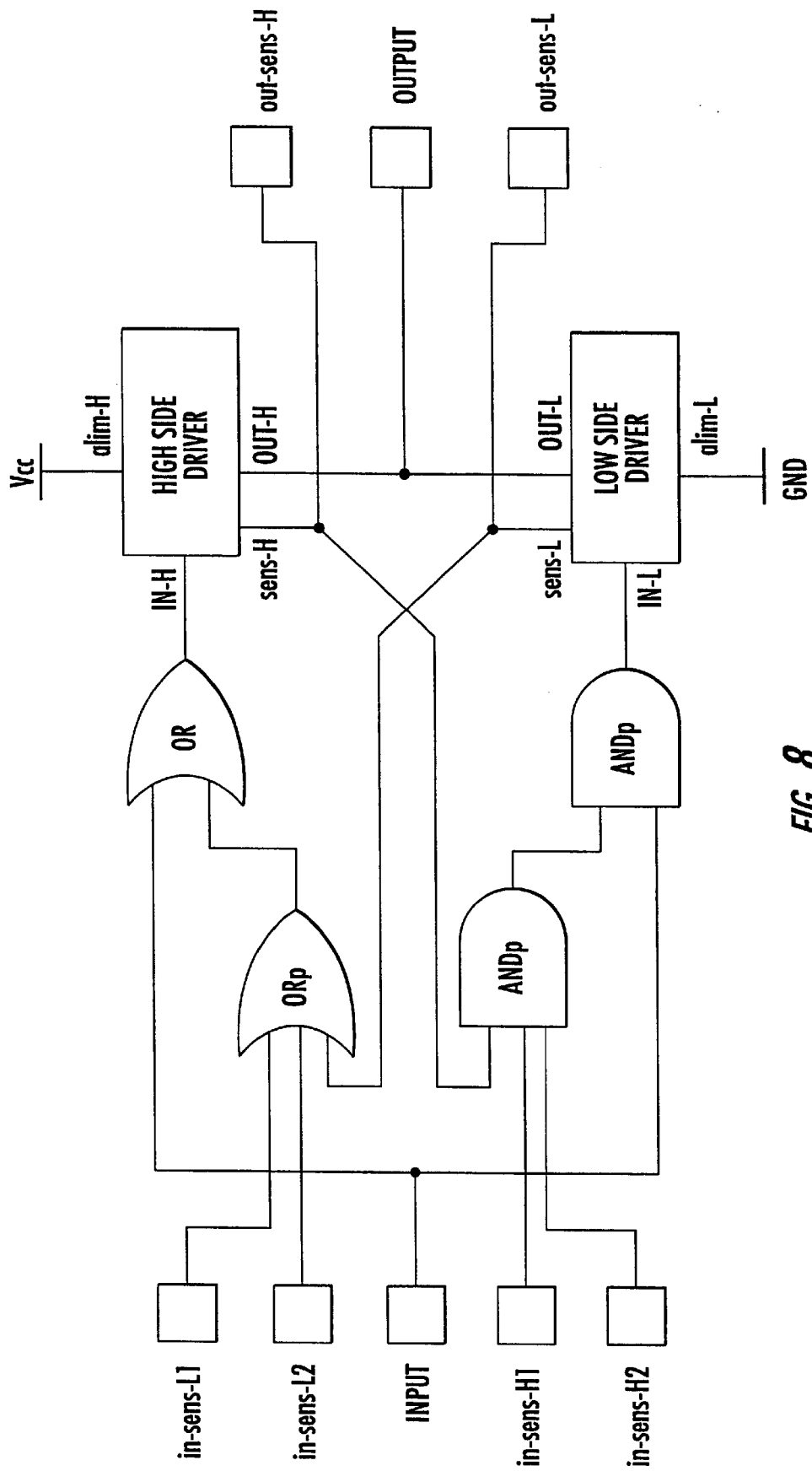
FIG. 8 is a scheme of a switching output stage of the invention suitable to be paralleled with two other stages.

In the case of several power output stages, configurable in different modes to adapt the output of the amplifier to a different number of driven loads or to loads of different values, the combinatory logic circuit can be easily adapted depending on the number of output stages to support different paralleling schemes. Details of the combinatory logic circuit for each power stage of a pair of output power stages that may be connected in parallel to drive in a synchronous mode a single load, are depicted in FIG. 8.

Figure 9:
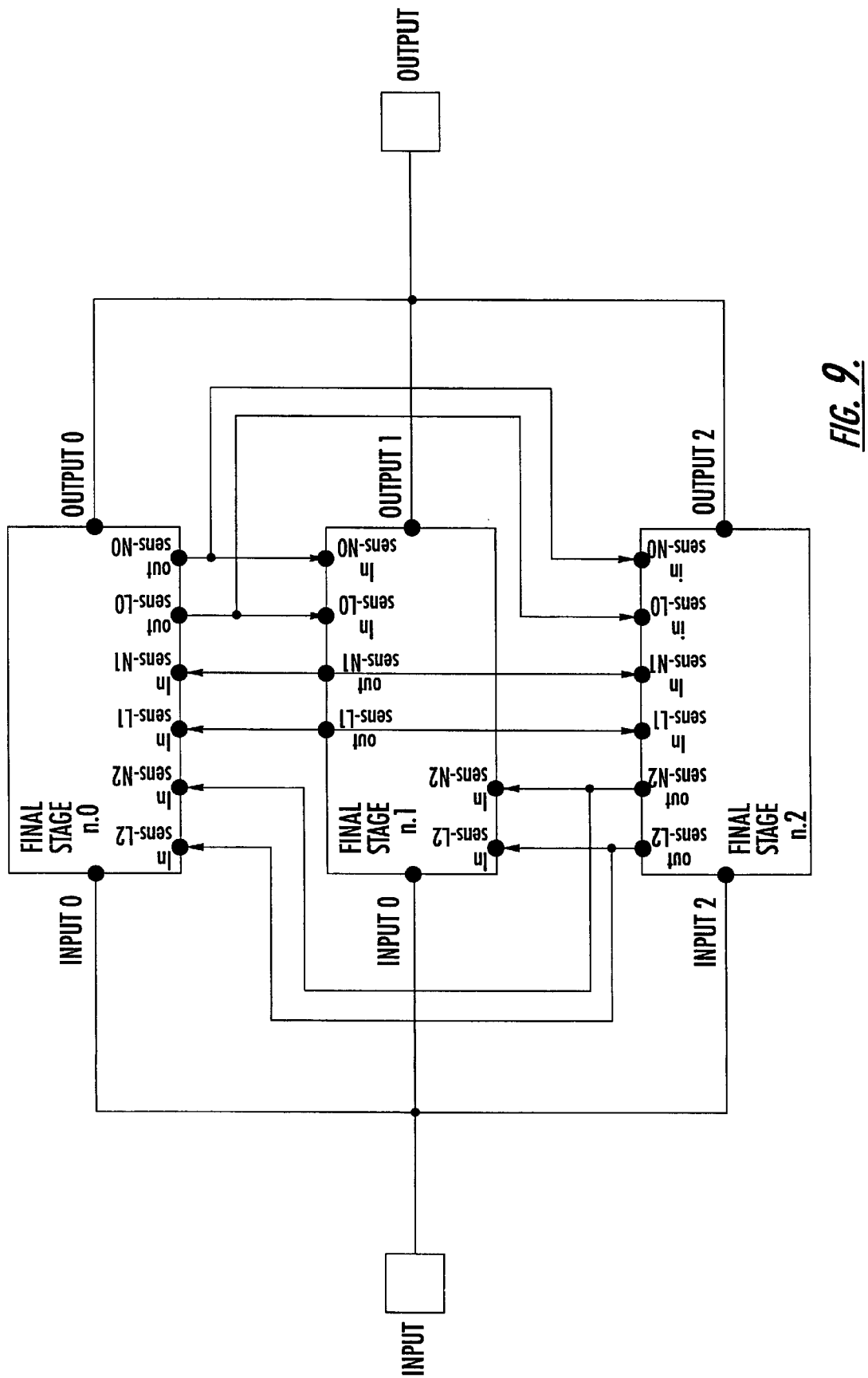
FIG. 9 is a connection scheme for three output power stages of FIG. 8.

FIG. 9 shows a paralleling scheme of three final stages. For sake of simplicity, in FIGS. 5, 7 and 8 it is assumed that the combinatory logic circuit and the inverters I1 and I2 generating the pair of logic signal sens-H and sens-L, be powered at the same supply voltage Vcc of the output stage power. In many instances this may not be true, being relatively common to supply the output power stages with a voltage advantageously higher than the supply voltage of the control logic circuits and in general of the modulation and drive circuits.

In these cases it is often necessary to make the combinatory logic circuitry of the output power stage of the invention compatible with high voltage signals by the use of appropriate level shifting stages capable of withstanding the relatively high supply voltage Vcc of the output stage. In general, according to a common technique, when a logic signal must propagate from a high voltage section to low voltage section, it is necessary to interpose level shifting stages capable of withstanding the full supply voltage.

Figure 10:
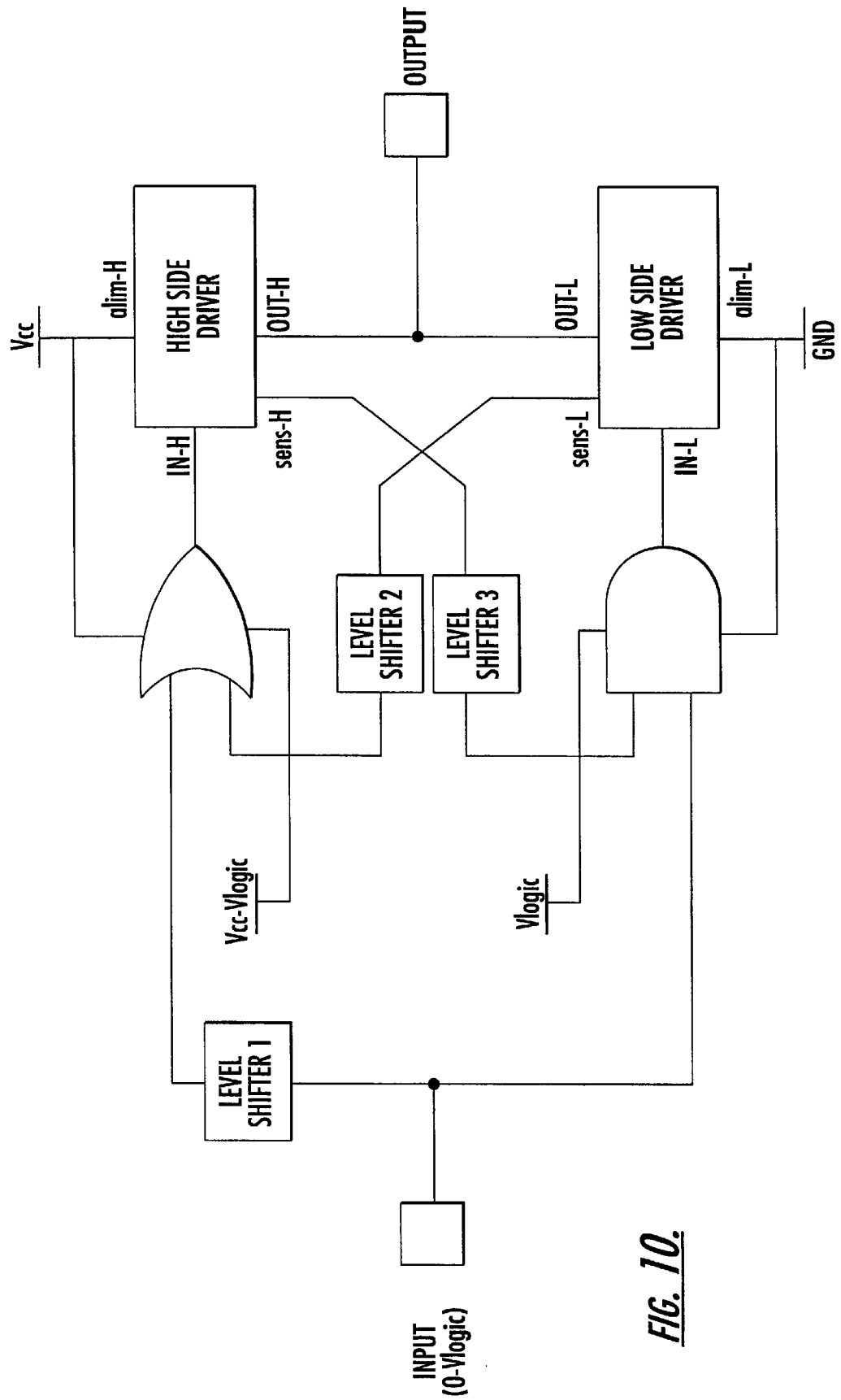
FIG. 10 is a basic diagram of an output power stage of the invention in which the supply voltage of the output stage is higher than the supply voltage of the control logic circuitry.

A modified diagram of the output power stage of the invention, provided with level shifters: LEVEL SHIFTER 1, LEVEL SHIFTER 2 and LEVEL SHIFTER 3, is shown in FIG. 10. As depicted, the logic gates driving the Low SIDE DRIVER are supplied between the node VLOGIC and ground while the sections driving the HIGH SIDE DRIVER are supplied between the Vcc linr and the VCC-VLOGIC node.

Of course, the combinatory logic circuit for conditioning the turn-on of the power output stage complementary devices may be realized using different logic circuits equivalent to each other according to the boolean algebra rules, and the signs of the outputs and of the inputs sensing the cut-off state or the turn-on state of the power switching devices can be complementary to those illustrated in the figures.

Figure 11:
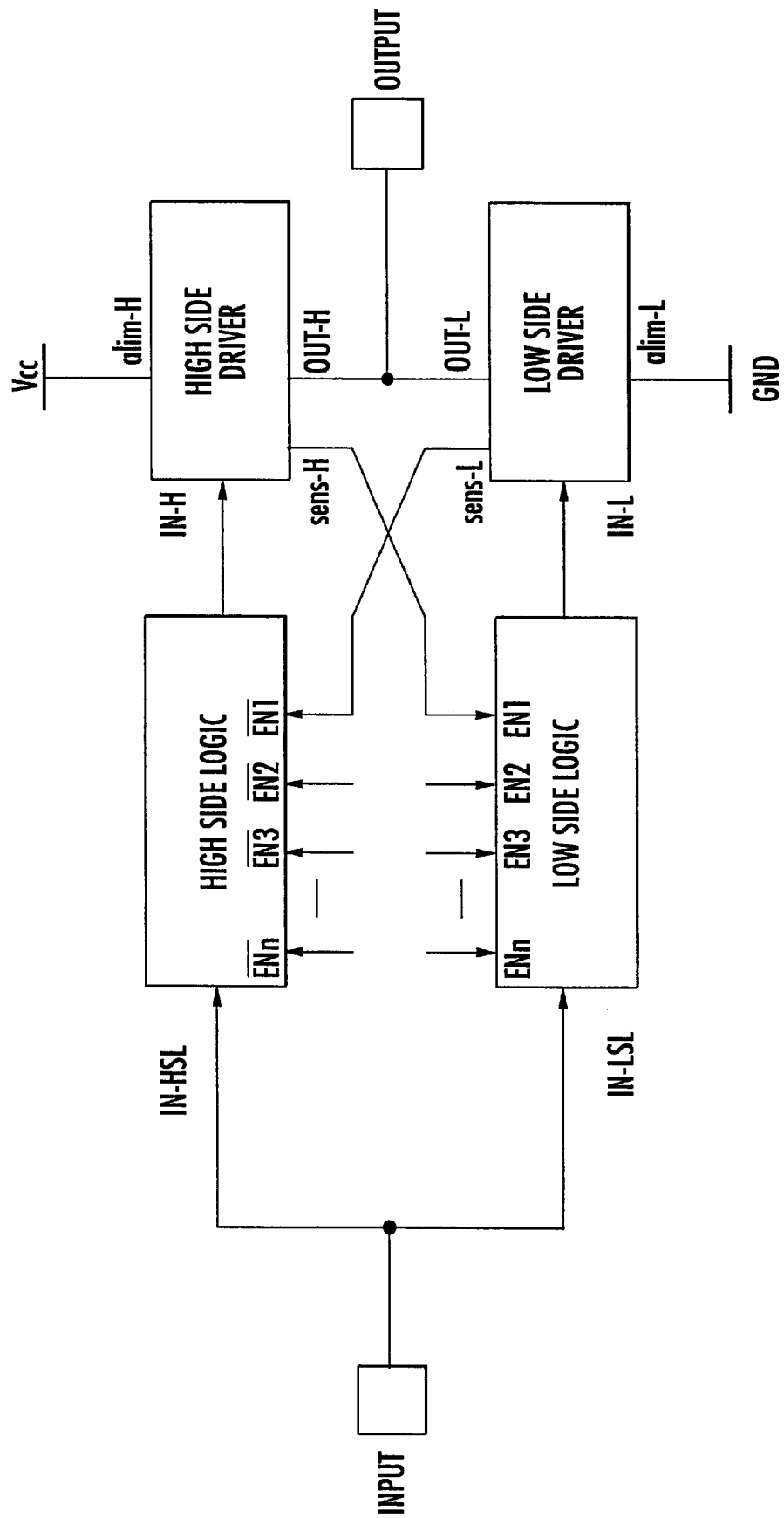
FIG. 11 is a generalized block diagram of the power output stage of the invention.

A more general functional block diagram of a power switching output stage of the invention is shown in FIG. 11, wherein the blocks, HIGH SIDE LOGIC and Low SIDE LOGIC, are respectfully provided with a plurality of logic inputs for as many pairs of logic signals representing the state of the respective power switching devices of a plurality of output power stages, eventually paralleled among themselves.

That which is claimed is:

1. A power switching output stage for switching an output between a supply voltage and ground, the power switching output stage comprising:
   an output node;
   at least one power device for switching the output node to the supply voltage;
   at least one complementary power device for switching the output node to ground;
   the at least one power device and the at least one complementary power device being driven in phase opposition by a pulse width modulated digital drive signal;
   a detector for detecting a turn-off state of each of the power devices, and for generating a pair of logic signals; and
   a combination logic circuit for combining the drive signal and the pair of logic signals and for generating a pair of driving signals of opposite phase for the power devices, wherein the turning-on of either of the power devices is permitted upon verification of a substantially attained turn-off state of the other power device.

2. An output stage according to claim 1, wherein the at least one power device comprises a first transistor and the at least one complementary power device comprises a third transistor; and wherein the detector comprises a first sensor connected to the first transistor, and a second sensor connected to the third transistor; the first sensor comprising a second transistor of a same type as the first transistor and of fractional characteristics with respect to the characteristics of the first transistor which is driven in parallel by a respective one of the pair of driving signals, a first biasing current generator connected between a drain of the second transistor and ground, and a first inverter having an input connected to the drain of the second transistor and for outputting a respective logic signal of the pair of logic signals; and the second sensor comprising a fourth transistor of a same type as the third transistor and of fractional characteristics with respect to the characteristics of the third transistor which is driven in parallel by a respective one of the pair of driving signals, a second biasing current generator connected between a drain of the fourth transistor and the supply voltage, and a second inverter having an input connected to the drain of the fourth transistor and for outputting a respective logic signal of the pair of logic signals.

3. An output stage according to claim 2, wherein a threshold level of the first and second inverters is established by dimensioning the respective first and second biasing current generators to introduce a fixed delay of the switching from a turn-off state to a turn-on state of the power devices sufficient to verify a substantial turn-off of the other power device.

4. An output stage according to claim 2, wherein the combination logic circuit comprises:

an AND gate for receiving the drive signal and the logic signal generated by the first sensor and for driving the complementary power device to ground; and an OR gate for receiving the drive signal and the logic signal generated by the second sensor and for driving the power device to the supply voltage.

5. An output stage according to claim 1, wherein combination logic circuit is supplied with the supply voltage.

6. An output stage according to claim 1, wherein the combination logic circuit is supplied with a lower supply voltage than the supply voltage, and wherein the logic circuit comprises voltage level shifter stages for withstanding the supply voltage.

7. A power switching output stage for switching an output between a supply voltage and ground, the power switching output stage comprising:

an output node;

a power device being driven by a pulse width modulated digital drive signal and for switching the output node to the supply voltage, the power device including a first detector for detecting a turn-off state of the power device and for generating a first logic signal;

a complementary power device being driven by the pulse width modulated digital drive signal in phase opposition to the power device, and for switching the output node to ground, the complementary power device including a second detector for detecting a turn-off state of the complementary power device and for generating a second logic signal; and a combination logic circuit for combining the drive signal and the first and second logic signals and for generating a pair of driving signals of opposite phase for the power devices, wherein the turning-on of either of the power devices is permitted upon verification of a substantially attained turn-off state of the other power device.

8. An output stage according to claim 7, wherein the power device comprises a first transistor and the complementary power device comprises a third transistor; and wherein the first detector comprises a second transistor of a same type as the first transistor and of fractional characteristics with respect to the characteristics of the first transistor which is driven in parallel by a respective one of the pair of driving signals, a first biasing current generator connected between a drain of the second transistor and ground, and a first inverter having an input connected to the drain of the second transistor and for outputting a respective logic signal of the pair of logic signals; and the second detector comprises a fourth transistor of a same type as the third transistor and of fractional characteristics with respect to the characteristics of the third transistor which is driven in parallel by a respective one of the pair of driving signals, a second biasing current generator connected between a drain of the fourth transistor and the supply voltage, and a second inverter having an input connected to the drain of the fourth transistor and for outputting a respective logic signal of the pair of logic signals.

9. An output stage according to claim 8, wherein a threshold level of the first and second inverters is established by dimensioning the respective first and second biasing current generators to introduce a fixed delay of the switching from a turn-off state to a turn-on state of the power devices sufficient to verify a substantial turn-off of the other power device.

10. An output stage according to claim 7, wherein the combination logic circuit comprises:

an AND gate for receiving the drive signal and the logic signal generated by the first detector and for driving the complementary power device to ground; and an OR gate for receiving the drive signal and the logic signal generated by the second detector and for driving the power device to the supply voltage.

11. An output stage according to claim 7, wherein the combination logic circuit is supplied with the supply voltage.

12. An output stage according to claim 7, wherein the combination logic circuit is supplied with a lower supply voltage than the supply voltage, and wherein the logic circuit comprises voltage level shifter stages for withstanding the supply voltage.

13. A multichannel audio amplifier comprising:

at least one power switching output stage for switching an output between a supply voltage and ground, the power switching output stage comprising an output node,
  a power device being driven by a pulse width modulated digital drive signal and for switching the output node to the supply voltage, the power device including a first detector for detecting a turn-off state of the power device and for generating a first logic signal,
  a complementary power device being driven by the pulse width modulated digital drive signal in phase opposition to the power device, and for switching the output node to ground, the complementary power device including a second detector for detecting a turn-off state of the complementary power device and for generating a second logic signal, and
  a combination logic circuit for combining the drive signal and the first and second logic signals and for generating a pair of driving signals of opposite phase for the power devices, wherein the turning-on of either of the power devices is permitted upon verification of a substantially attained turn-off state of the other power device.

14. A multichannel audio amplifier according to claim 13, wherein the power device comprises a first transistor and the complementary power device comprises a third transistor; and wherein the first detector comprises
  a second transistor of a same type as the first transistor and of fractional characteristics with respect to the characteristics of the first transistor which is driven in parallel by a respective one of the pair of driving signals,
  a first biasing current generator connected between a drain of the second transistor and ground, and
  a first inverter having an input connected to the drain of the second transistor and for outputting a respective logic signal of the pair of logic signals; and
the second detector comprises
  a fourth transistor of a same type as the third transistor and of fractional characteristics with respect to the characteristics of the third transistor which is driven in parallel by a respective one of the pair of driving signals,
  a second biasing current generator connected between a drain of the fourth transistor and the supply voltage, and
  a second inverter having an input connected to the drain of the fourth transistor and for outputting a respective logic signal of the pair of logic signals.

15. A multichannel audio amplifier according to claim 14, wherein a threshold level of the first and second inverters is established by dimensioning the respective first and second biasing current generators to introduce a fixed delay of the switching from a turn-off state to a turn-on state of the power devices sufficient to verify a substantial turn-off of the other power device.

16. A multichannel audio amplifier according to claim 13, wherein the combination logic circuit comprises:
  an AND gate for receiving the drive signal and the logic signal generated by the first detector and for driving the complementary power device to ground; and
  an OR gate for receiving the drive signal and the logic signal generated by the second detector and for driving the power device to the supply voltage.

17. A multichannel audio amplifier according to claim 13, wherein the combination logic circuit is supplied with the supply voltage.

18. A multichannel audio amplifier according to claim 13, wherein the combination logic circuit is supplied with a lower supply voltage than the supply voltage, and wherein the logic circuit comprises voltage level shifter stages for withstanding the supply voltage.

19. A multichannel audio amplifier according to claim 13, wherein the at least one power switching output stage comprises a plurality of power switching output stages; and wherein each combination logic circuit combines the drive signal with a plurality of pairs of the logic signals corresponding to the plurality of power switching output stages to connect the plurality of power switching output stages in parallel.

20. A method of switching an output node of a power switching output stage between a supply voltage and ground, the method comprising the steps of:
  driving a power device with a pulse width modulated digital drive signal to switch the output node to the supply voltage;
  detecting a turn-off state of the power device and generating a first logic signal;
  driving a complementary power device with the pulse width modulated digital drive signal in phase opposition to the power device to switching the output node to ground;
  detecting a turn-off state of the complementary power device and generating a second logic signal; and
  combining the drive signal and the first and second logic signals to generate a pair of driving signals of opposite phase for the power devices, wherein the turning-on of either of the power devices is permitted upon verification of a substantially attained turn-off state of the other power device.

21. A method according to claim 20, wherein the power device comprises a first transistor and a first detector, and the complementary power device comprises a third transistor and a second detector; and wherein the first detector comprises
  a second transistor of a same type as the first transistor and of fractional characteristics with respect to the characteristics of the first transistor which is driven in parallel by a respective one of the pair of driving signals,
  a first biasing current generator connected between a drain of the second transistor and ground, and
  a first inverter having an input connected to the drain of the second transistor and for outputting a respective logic signal of the pair of logic signals; and
the second detector comprises
  a fourth transistor of a same type as the third transistor and of fractional characteristics with respect to the characteristics of the third transistor which is driven in parallel by a respective one of the pair of driving signals,
  a second biasing current generator connected between a drain of the fourth transistor and the supply voltage, and
  a second inverter having an input connected to the drain of the fourth transistor and for outputting a respective logic signal of the pair of logic signals.

22. A method according to claim 21, further comprising the step of establishing a threshold level of the first and second inverters by dimensioning the respective first and second biasing current generators to introduce a fixed delay of the switching from a turn-off state to a turn-on state of the power devices sufficient to verify a substantial turn-off of the other power device.

23. A method according to claim 20, wherein the step of combining the drive signal and the first and second logic signals comprises:

combining the drive signal and the logic signal generated by the first detector with an AND gate to drive the complementary power device to ground; and combining the drive signal and the logic signal generated by the second detector with an OR gate to drive the power device to the supply voltage.

\* \* \* \* \*

UNITED STATES PATENT AND TRADEMARK OFFICE
CERTIFICATE OF CORRECTION

PATENT NO.   : 6,288,605 B1
DATED        : September 11, 2001
INVENTOR(S)  : Edoardo Botti and Danilo Ranieri It is certified that error appears in the above-identified patent and that said Letters Patent is hereby corrected as shown below:

Title page,
Item [73], delete "STMicroelectronics S.R.L." insert -- STMicrolectronics S.r.l. --

Column 1,
Line 22, delete "(Low SIDE" insert -- (LOW SIDE --
Line 58, delete "moreover," insert -- Moreover, --

Column 3,
Line 11, delete "and Low" insert -- and LOW --
Line 18, delete "the Low SIDE" insert -- the LOW SIDE --
Line 38, delete "1/100$^{th}$" insert -- 1/1000$^{th}$ --

Column 4,
Line 30, delete "the Low SIDE" insert -- the LOW SIDE --
Line 45, delete "and Low SIDE" insert -- and LOW SIDE --

Signed and Sealed this

Twenty-fifth Day of June, 2002

Attest:

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.     : 6,288,605 B1
DATED          : September 11, 2001
INVENTOR(S)    : Edoardo Botti and Danilo Ranieri It is certified that error appears in the above-identified patent and that said Letters Patent is hereby corrected as shown below:

<u>Title page,</u>
Item [73], Assignee: delete "STMicroelectronics S.R.L." insert
-- STM Microelectronics S.r.l. --

<u>Column 1,</u>
Line 22, delete "(Low SIDE" insert -- (LOW SIDE --
Line 58, delete "moreover," insert -- Moreover, --

<u>Column 3,</u>
Line 11, delete "and Low" insert -- and LOW --
Line 18, delete "the Low SIDE" insert -- the LOW SIDE --
Line 38, delete "1/100$^{th}$" insert -- 1/1000$^{th}$ --

<u>Column 4,</u>
Line 30, delete "the Low SIDE" insert -- the LOW SIDE --
Line 45, delete "and Low SIDE" insert -- and LOW SIDE --

This certificate supersedes Certificate of Correction issued June 25, 2002.

Signed and Sealed this

Twenty-sixth Day of November, 2002

*Attest:*

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO. : 6,288,605 B1
DATED : September 11, 2001
INVENTOR(S) : Edoardo Botti and Danilo Ranieri It is certified that error appears in the above-identified patent and that said Letters Patent is hereby corrected as shown below:

Title page,
Item [73], Assignee: delete "STMicroelectronics S.R.L." insert
-- STMicroelectronics S.r.l. --

Column 1,
Line 22, delete "(Low SIDE" insert -- (LOW SIDE --
Line 58, delete "moreover," insert -- Moreover, --

Column 3,
Line 11, delete "and Low" insert -- and LOW --
Line 18, delete "the Low SIDE" insert -- the LOW SIDE --
Line 38, delete "1/100$^{th}$" insert -- 1/1000$^{th}$ --

Column 4,
Line 30, delete "the Low SIDE" insert -- the LOW SIDE --
Line 45, delete "and Low SIDE" insert -- and LOW SIDE --

This certificate supersedes Certificate of Correction issued November 26, 2002.

Signed and Sealed this

Eleventh Day of February, 2003

JAMES E. ROGAN
*Director of the United States Patent and Trademark Office*